United States Patent
Fogel et al.

(10) Patent No.: US 9,406,506 B2
(45) Date of Patent: *Aug. 2, 2016

(54) LATTICE MATCHED ASPECT RATIO TRAPPING TO REDUCE DEFECTS IN III-V LAYER DIRECTLY GROWN ON SILICON

(71) Applicant: International Business Machines Corporation, Armonk, NY (US)

(72) Inventors: Keith E. Fogel, Hopewell Junction, NY (US); Pouya Hashemi, White Plains, NY (US); Ali Khakifirooz, Los Altos, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/534,131

(22) Filed: Nov. 5, 2014

(65) Prior Publication Data

US 2016/0126094 A1    May 5, 2016

(51) Int. Cl.
*H01L 21/02* (2006.01)
*H01L 29/20* (2006.01)
*H01L 29/06* (2006.01)

(52) U.S. Cl.
CPC ...... *H01L 21/02587* (2013.01); *H01L 21/0243* (2013.01); *H01L 21/02387* (2013.01); *H01L 21/02488* (2013.01); *H01L 21/02538* (2013.01); *H01L 21/02658* (2013.01); *H01L 29/0657* (2013.01); *H01L 29/20* (2013.01)

(58) Field of Classification Search
CPC .............................................. H01L 21/02587
See application file for complete search history.

(56) References Cited

U.S. PATENT DOCUMENTS

| | | | |
|---|---|---|---|
| 6,890,816 B2 | 5/2005 | Liang |
| 7,202,503 B2 | 4/2007 | Chow |
| 8,143,646 B2 | 3/2012 | Hudait |
| 8,183,134 B2 | 5/2012 | Wu |
| 8,455,929 B2 | 6/2013 | Ko |
| 8,574,968 B2 | 11/2013 | Arena |
| 8,629,040 B2 | 1/2014 | Chang |
| 8,759,203 B2 | 6/2014 | Wann |
| 2002/0167070 A1 | 11/2002 | Prendergast |
| 2009/0039361 A1 | 2/2009 | Li |

(Continued)

OTHER PUBLICATIONS

Keith E Fogel et al., unpublished U.S. Appl. No. 14/820,669, filed Aug. 7, 2015, pp. 1-14 plus 3 sheets drawings.

(Continued)

*Primary Examiner* — Jerome Jackson, Jr.
*Assistant Examiner* — Charles R Peters
(74) *Attorney, Agent, or Firm* — Daniel P. Morris; Otterstedt, Ellenbogen & Krammer, LLP

(57) ABSTRACT

A structure having application to electronic devices includes a III-V layer having high crystal quality and a low defect density on a lattice mismatched substrate. Trenches are formed in a layer of III-V semiconductor material grown on a substrate having a different lattice constant. Dielectric material is deposited within the trenches, forming dielectric regions. A portion of the layer of III-V material is removed, leaving new trenches defined by the dielectric regions. A new layer of III-V semiconductor material having reduced defect density is grown on the remaining portion of the originally deposited III-V semiconductor layer and within the trenches defined by the dielectric regions.

11 Claims, 3 Drawing Sheets

(56) References Cited

U.S. PATENT DOCUMENTS

| | | |
|---|---|---|
| 2009/0093122 A1 | 4/2009 | Ueda |
| 2009/0098343 A1 | 4/2009 | Arena |
| 2013/0062665 A1 | 3/2013 | Kunert |
| 2013/0270512 A1 | 10/2013 | Radosavljevic |
| 2014/0011341 A1* | 1/2014 | Maszara ........... H01L 29/66795 438/478 |
| 2014/0033981 A1 | 2/2014 | Wann |
| 2014/0209979 A1 | 7/2014 | Lau |
| 2014/0291810 A1 | 10/2014 | Bugge |

OTHER PUBLICATIONS

List of IBM Patents or Applications Treated as Related.

* cited by examiner

LATTICE MATCHED ASPECT RATIO TRAPPING TO REDUCE DEFECTS IN III-V LAYER DIRECTLY GROWN ON SILICON

FIELD

The present disclosure relates generally to semiconductor devices and fabrication methods, and more specifically, to reducing defects in III-V semiconductor films grown on substrates having lattice constants that do not match the lattice constants of the films.

BACKGROUND

III-V compounds offer a number of advantages over silicon with respect to the operation of semiconductor devices such as field-effect transistors. The heterointegration of III-V compounds on materials such as silicon allows the co-integration of III-V nFETs with SiGe pFETs. III-V and CMOS is one possible option for sub-10 nm technology nodes.

III-V semiconductors have larger lattice constants than silicon, so integrating them on silicon is challenging. Methods for integrating III-V semiconductors on silicon have included blanket III-V growth and aspect ratio trapping (ART). Blanket growth traps most of the misfit dislocations near the lattice mismatched interface, but threading dislocations still reach the surface semiconductor material. Defect densities are in the 1e7 to 1e9/cm$^2$ range. The deposition of thick III-V layers is required when using the blanket deposition technique.

Aspect ratio trapping is an effective technique to trap threading dislocations, thereby reducing the dislocation density of lattice mismatched materials grown on silicon. The ART technique can be performed using thinner III-V layers. Trenches are employed for trapping misfit threading dislocations by stopping their propagation. The III-V material is grown in narrow trenches. The dislocations end at the trench walls, but fairly high defect densities up to 1e8/cm$^2$ can still be observed.

The performance of devices fabricated using dissimilar semiconductor materials can be materially affected by defects that cause abrupt changes in electrical and/or optical properties. Adverse effects due to misfit defects and threading dislocations should be minimized or avoided in the fabrication of electronic devices incorporating such semiconductor materials.

SUMMARY

Principles of the present disclosure provide techniques for addressing defectivity issues in the manufacture of devices employing semiconductor materials having dissimilar properties such as lattice constants.

An exemplary method includes obtaining a structure including a semiconductor substrate having a first lattice constant, a first epitaxial layer of III-V semiconductor material having a second lattice constant different from the first lattice constant directly adjoining a top surface of the semiconductor substrate, and a plurality of first trenches extending vertically within the first epitaxial layer of III-V semiconductor material, the first trenches having bottom ends terminating a distance above the top surface of the semiconductor substrate. The first trenches are filled with a dielectric material to form a plurality of dielectric regions within the first epitaxial layer of III-V semiconductor material. A portion of the first epitaxial layer of III-V semiconductor material is removed to form a plurality of vertically oriented second trenches between the dielectric regions. The method further includes epitaxially growing a second layer of III-V semiconductor material directly on the first epitaxial layer of III-V semiconductor material and within the plurality of second trenches.

An exemplary semiconductor structure includes a semiconductor substrate having a first lattice constant, an epitaxial blanket layer comprising III-V semiconductor material on a top surface of the semiconductor substrate, the epitaxial blanket layer having a second lattice constant different from the first lattice constant. A plurality of parallel, dielectric regions extend vertically from a top surface of the epitaxial blanket layer, the parallel, dielectric regions defining a plurality of vertically extending trenches. An epitaxial second layer comprising III-V semiconductor material directly contacts the epitaxial blanket layer and is positioned within the vertically extending trenches.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

Substantial beneficial technical effects are provided. For example, one or more embodiments may provide one or more of the following advantages:

Reducing the defect density of III-V compounds grown on substrates having dissimilar lattice constants;

Facilitates manufacture of III-V devices, including FET and semiconductor laser devices.

These and other features and advantages of the present disclosure will become apparent from the following detailed description of illustrative embodiments thereof, which is to be read in connection with the accompanying drawings.

BRIEF DESCRIPTION OF THE DRAWINGS

The following detailed description, given by way of example, will best be appreciated in conjunction with the accompanying drawings, which are not necessarily to scale, and wherein like reference numerals denote like elements and parts, in which.

DETAILED DESCRIPTION

In accordance with the embodiments disclosed herein, III-V layers having low defect densities are obtained. Such layers can be employed in III-V nFET and/or pFET fabrication or other purposes that benefit from the absence of threading dislocations.

Figure 1:
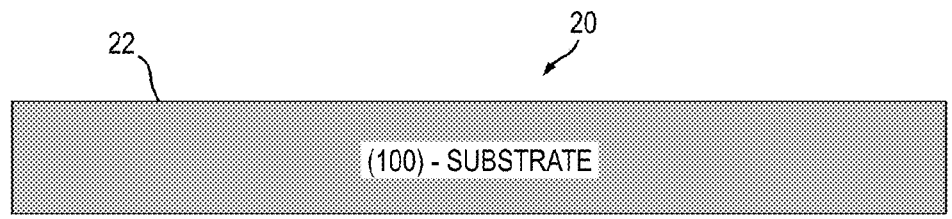
FIG. 1 is a schematic, sectional view of a starting silicon substrate.

Referring to FIG. 1, a crystalline semiconductor substrate 20 having a top surface 22 is provided. The substrate consists essentially of silicon in one or more embodiments. In some embodiments, the starting substrate is germanium on silicon. Depending upon intended applications, other semiconductor substrates may be employed such as semiconductor-on-insulator substrates and substrates that are doped with impurities to render them p-type or n-type. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminium, gallium and indium. As used herein, "n-type" refers to the addition of impurities that contributes free electrons to an intrinsic semiconductor. In a silicon-containing substrate, examples of n-type dopants, i.e., impurities, include but are not limited to antimony, arsenic and phosphorous. Single crystal silicon wafers are commercially available and are characterized by a diamond cube lattice structure. As known in the art, the Miller indices of a substrate are determined from the reciprocals of the points at which the crystal plane of silicon intersects the principle crystalline axes. While the exemplary embodiments are described below with reference to doped or undoped (100) silicon as a substrate material, it will be appreciated that the principles expressed are applicable to other semiconductor substrates and substrates with crystallographic orientations other than (100) on which III-V semiconductor materials can be epitaxially grown, including off-axis silicon substrates.

Figure 2:
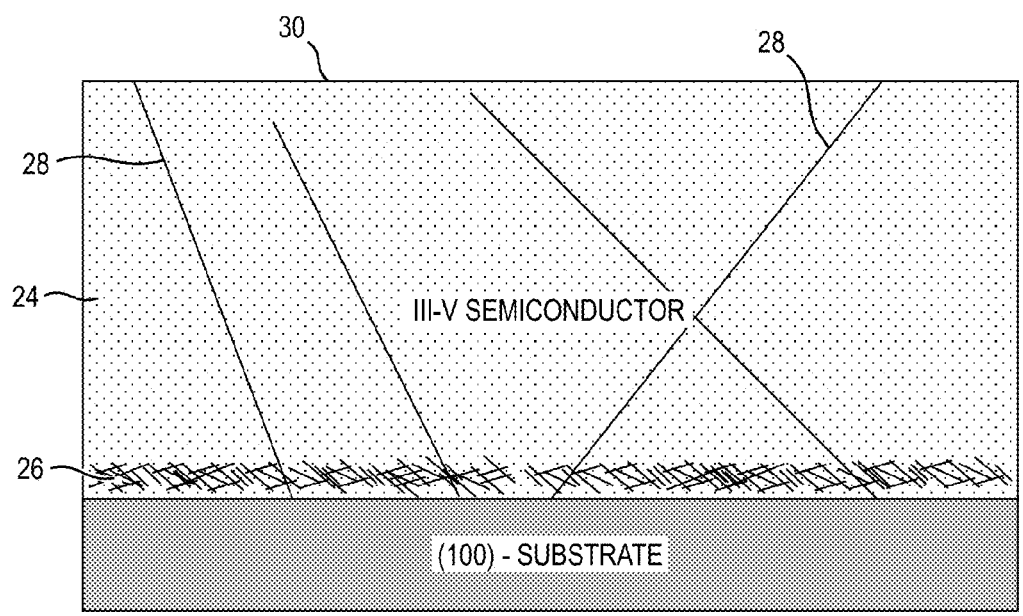
FIG. 2 is schematic illustration showing the substrate following growth of a layer of III-V semiconductor material on the starting silicon substrate shown in FIG. 1.

Referring to FIG. 2, a blanket layer 24 of III-V semiconductor material is epitaxially grown directly on the top surface 22 of the substrate 20. The blanket layer 24 can include one or more layers, with different III-V semiconductor materials grown on each other. In some embodiments including multiple III-V layers, at least one layer of III-V semiconductor material has a larger lattice constant than the underlying layer of III-V semiconductor material. As discussed further below, the blanket layer provides a lattice matched template for aspect ratio trapping. Exemplary III-V semiconductor materials include but are not limited to gallium arsenide (GaAs), indium phosphide (InP) and indium gallium arsenide (InGaAs). These exemplary III-V materials are grown in order on the substrate 20 in some embodiments, forming the blanket layer 24. As known in the art, indium phosphide and indium gallium arsenide have larger lattice constants than gallium arsenide. The lattice constants of $In_{0.53}Ga_{0.47}As$ and InP are the same, allowing a high quality InGaAs layer to be grown on InP. The surface 22 of the substrate is cleaned if required to remove materials such as oxides that may be present. Various processes are familiar to those of skill in the art for growing III-V semiconductor materials on silicon substrates. Such processes include metalorganic chemical vapor deposition (MOCVD) and molecular beam epitaxy (MBE). Many different III-V compounds could be grown on the substrate 20 and accordingly multiple precursors could be used. Depending on which III-V material(s) is to be grown and which precursor is used, different parameters (temperature, process pressure, times, etc.) are applicable. Metalorganic prescursors include Trimethylgallium, Trimethylaluminum, Trimethylindium, Trimethylantimony, Tertiarybutylarsine and Tertiarybutylphosphine. Alternate Group V precursors include arsine and phosphine. Depending which Group V source is used, process temperature, gas flow, pressure and times vary significantly. The process parameters for growing III-V semiconductor materials on silicon and on other III-V semiconductor materials are well known in the art and new methods continue to be developed. The deposited layer 24 that directly contacts the top surface 22 of the substrate 20 includes misfit defects 26 near the interface with the surface 22 of the substrate 20 and threading dislocations 28 that propagate towards the surface 30. Dislocation density of the layer 24 is in the range of $10^7$-$10^9$ cm$^{-2}$ in some embodiments. In one or more embodiments, the layer 24 has a thickness between 500 nm and 5 μm. As discussed above, the layer 24 may in fact consist of multiple III-V semiconductor layers, in which case the bottom III-V semiconductor layer that directly contacts the top surface 22 of the substrate would include misfit defects 26 caused by the lattice mismatch with the substrate 20 while the threading dislocations extend within the succeeding III-V semiconductor layer(s).

Figure 3:
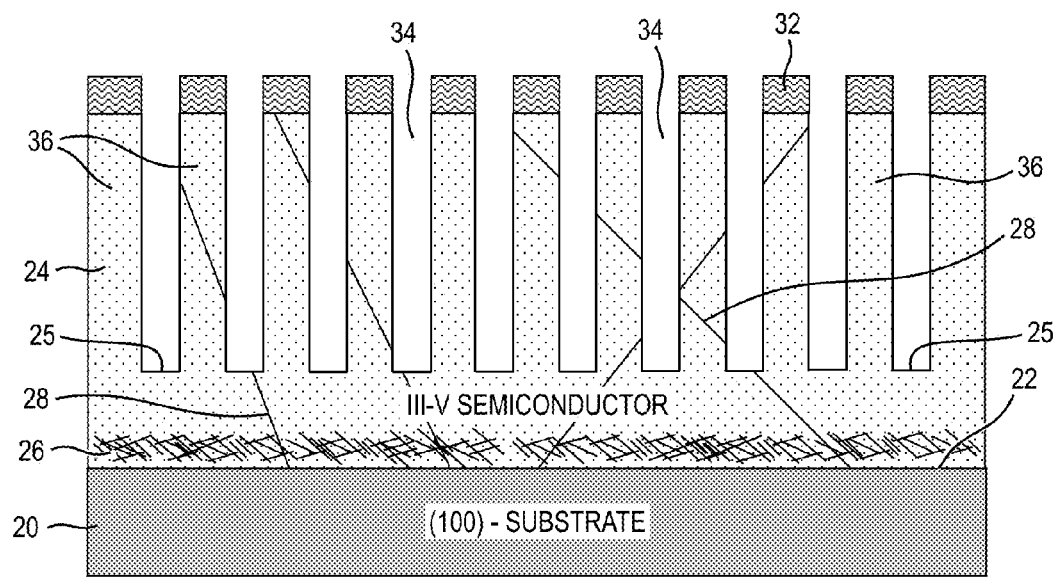
FIG. 3 is a schematic illustration showing a patterned hard mask on the III-V semiconductor layer and trenches formed in the layer of III-V semiconductor material.

A mask 32 comprising silicon nitride ($Si_3N_4$), silicon dioxide ($SiO_2$) or other suitable material is deposited on the III-V semiconductor layer and patterned. The patterned mask 32 is shown in FIG. 3. Plasma enhanced chemical vapor deposition (PECVD) is a known process for depositing silicon nitride layers and can be used for depositing the mask layer. Once the mask is patterned, parallel first trenches 34 of substantially equal depth are formed in the III-V semiconductor blanket layer 24. The depth of the trenches 34 is less than the thickness of the III-V semiconductor layer 24 in which they are formed. Accordingly, a top surface 25 of the semiconductor layer 24 is exposed at the bottoms of the first trenches 34. In some embodiments, the trenches are 50 nm-2 μm in depth. The trenches terminate above the portion of the III-V semiconductor layer near the surface 22 of the substrate that contains the misfit defects 26. In embodiments wherein the blanket layer 24 is a multilayer structure comprising layers of different III-V materials having increasing lattice constants in order of deposition, as discussed above, the trenches 34 may terminate above the III-V semiconductor layer formed directly on the substrate 20 and within a III-V semiconductor layer formed on or above the layer having the relatively small lattice constant that is formed directly on the substrate 20. The depth of each trench exceeds the width dimension(s) thereof, preferably by at least a factor of two. A directional etch process such as reactive ion etching (RIE) can be employed to form the vertical trenches 34 in areas that are not protected by the patterned mask 32. Parallel columns 36 of III-V material that remain beneath the patterned mask 32 have substantially straight side walls following the directional etch of the blanket layer 24.

Figure 4:
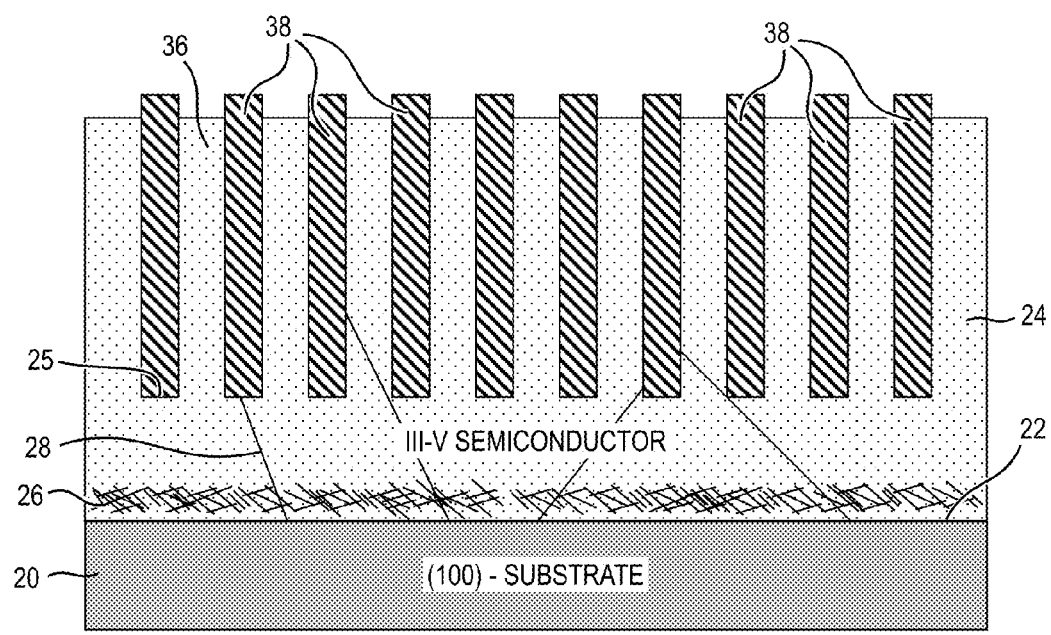
FIG. 4 is a schematic illustration showing the trenches in the layer of III-V semiconductor material filled with a dielectric material and following removal of the hard mask.

Referring to FIG. 4, the trenches 34 formed in the III-V semiconductor layer 24 are filled with a dielectric material, forming dielectric regions 38 that adjoin the exposed top surface 25 thereof. Suitable dielectric materials for forming the dielectric regions include silicon dioxide, silicon nitride, and silicon oxynitride. These materials should be considered exemplary rather than limiting. Techniques such as PECVD or spin-on may be employed for depositing the dielectric material used to form the dielectric regions 38. The patterned hard mask 32 is stripped using, for example, a wet etch such as ortho-phosphoric acid in embodiments where the hard mask 32 comprises silicon nitride. The hard mask 32 may be stripped prior to or after forming the dielectric regions 38, depending on the materials employed. If chemical removal of the hard mask 32 would damage the III-V semiconductor material(s) employed in the structure, the mask 32 could be removed using chemical mechanical polishing. The top surface of the resulting structure is subjected to chemical mechanical polishing (CMP) whether or not the hard mask is removed chemically or by CMP.

Figure 5:
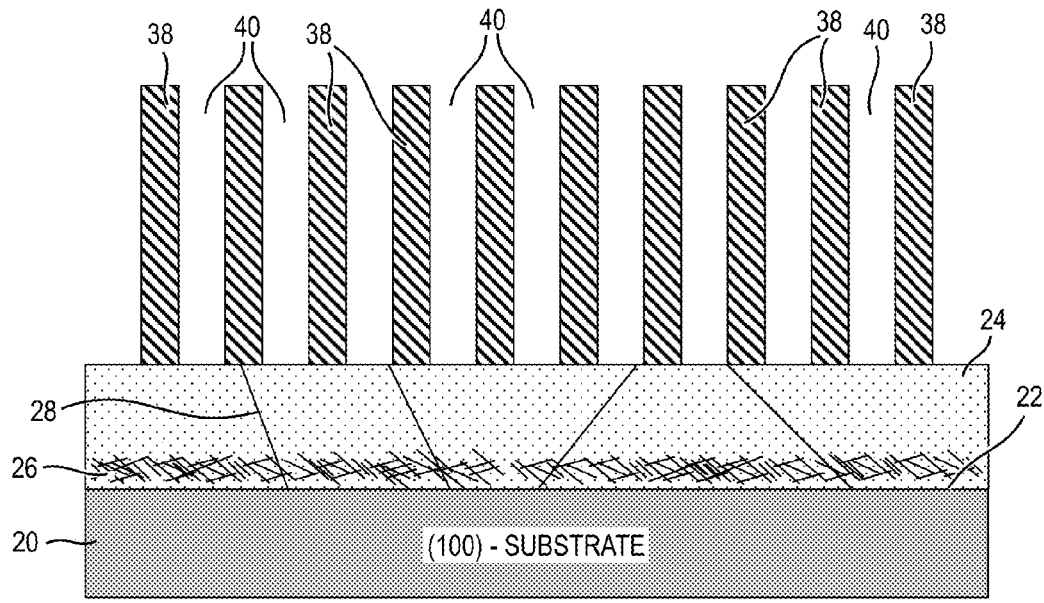
FIG. 5 is a schematic illustration showing the structure of FIG. 4 following recessing of the layer of III-V semiconductor material.

A portion of the III-V semiconductor blanket layer 24 is removed, as shown in FIG. 5. In some embodiments, the layer 24 is removed down to the bottoms of the dielectric regions 38. In some embodiments (not shown), a portion of the layer 24 remains between dielectric regions. The trenches formed between dielectric regions 38 should have width and depth dimensions that ensure the effective trapping of defects once a further III-V semiconductor layer is grown on the structure, as described below with respect to FIG. 6, whether or not a portion of the blanket layer remains between dielectric regions. Reactive ion etching and/or wet etching may be employed to remove the portion of the III-V semiconductor layer 24. If the III-V semiconductor layer 24 comprises gallium arsenide and the trench material comprising the dielectric regions 38 is silicon nitride, hydrofluoric acid may be employed for wet etching. If the trench material is oxide and the III-V material is gallium arsenide, a wet solution of citric acid, hydrogen peroxide and phosphoric acid may be employed for wet etching. The etch is selective to the III-V material(s) comprising the layer 24 so that the dielectric regions 38 remain substantially intact, forming an array of parallel walls, following partial removal of the III-V semiconductor layer 24. If a wet etch is employed, the etch should be timed to avoid etching beneath the plane defined by the bottoms of the dielectric regions 38 and thereby possibly undercutting these regions. Trenches 40 having dielectric walls are formed during the partial removal of the III-V semiconductor layer 24. The height to width ratio of the trenches 40 is preferably at least three, but higher ratios are preferred, such as 10:1 to 25:1. In embodiments wherein the blanket layer 24 is a multilayer structure comprised of layers of different III-V semiconductor materials, the trenches 40 preferably terminate within one of the layers above the layer that directly contacts the substrate 20. In one or more embodiments, the trenches 40 terminate within a sub-layer of the blanket layer 24 having a larger lattice constant than the sub-layer that directly contacts the substrate 20.

Figure 6:
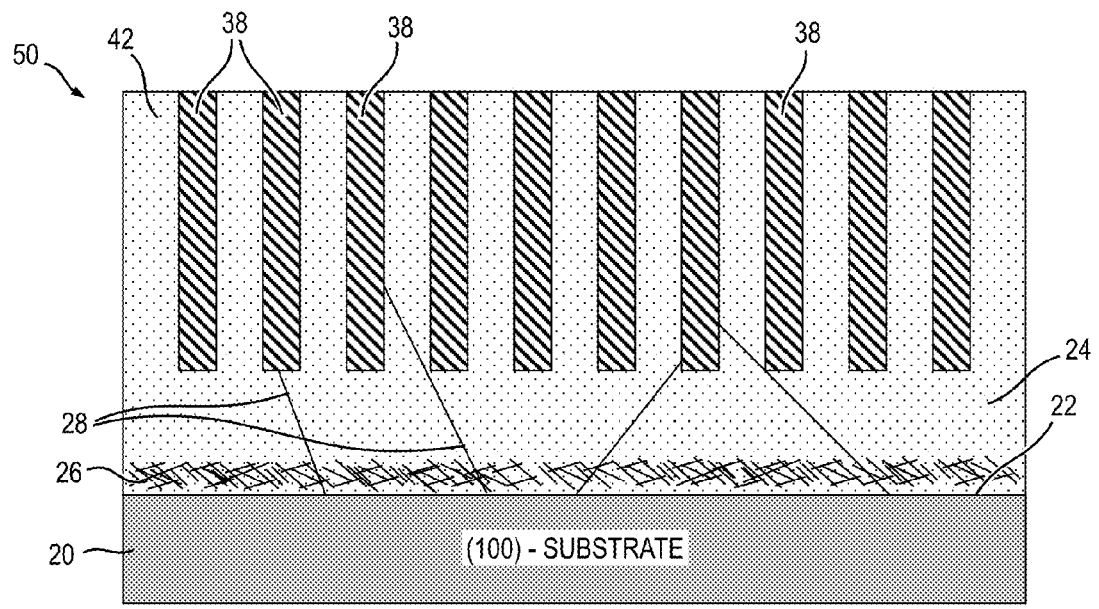
FIG. 6 is a schematic illustration showing the structure of FIG. 5 following growth of a second layer of III-V semiconductor material.

A new layer 42 of III-V semiconductor material is epitaxially grown on the structure shown in FIG. 5 to obtain the structure 50 shown in FIG. 6. In some embodiments, the new layer 42 has the same composition and/or lattice constant as the originally deposited blanket layer 24 (or the III-V material comprising the top sub-layer of a multi-layer blanket layer) and is lattice matched thereto. The new III-V semiconductor layer 42 has the same or only a slightly different lattice constant as the originally deposited blanket layer 24 (or sub-layer of a multilayer blanket layer) on which it is grown. Defects in the new layer are confined to the bottom portions of the trenches 40. No new threading dislocations are formed near the bottoms of the trenches as the lattices of the new III-V layer 42 and original blanket layer 24 are closely or entirely matched. The crystal quality of the newly formed layer 42 is such that, in some embodiments, defect density near the surface is about $1e4/cm^2$. It will be appreciated that the new III-V semiconductor layer 42 can also or alternatively be comprised of multiple III-V layers, and that such multiple layers can be of increasing lattice constant in the direction of the top surface of the resulting structure.

Given the discussion thus far, an exemplary method includes obtaining a structure including a semiconductor substrate 20 having a first lattice constant, a first epitaxial layer 24 of III-V semiconductor material having a second lattice constant adjoining a top surface 22 of the semiconductor substrate, and a plurality of first trenches 34 extending within the first epitaxial layer 24 of III-V semiconductor material, the first trenches being vertically oriented and having bottom ends terminating a distance above the top surface 22 of the semiconductor substrate. The bottom ends of the trenches 34 should be in a region of the layer 24 that is relatively low in defects, safely above the region containing the misfit defects 26. The lattice constant of the III-V material formed on the substrate and the number of III-V semiconductor layers employed to form the layer 24 are factors influencing the appropriate distance between the bottom ends of the trenches 34 and the top surface 22 of the substrate. An exemplary structure is shown schematically in FIG. 3. The method further includes filling the first trenches with a dielectric material to form a plurality of dielectric regions 38 as shown schematically in FIG. 4 within the first epitaxial layer 24 of III-V semiconductor material. A portion of the first epitaxial layer of III-V semiconductor material is removed to form a second plurality of vertical trenches 40 between the dielectric regions, such as shown schematically in FIG. 5. A second layer 42 of III-V semiconductor material is epitaxially grown on the first epitaxial layer 24 of III-V semiconductor material and within the plurality of second vertically oriented trenches 40. The structure 50 shown schematically in FIG. 6 is accordingly obtained. In some embodiments, the semiconductor substrate 20 is a monocrystalline silicon (100) substrate, which may be off-axis. The first and second layers 24, 42 of III-V semiconductor materials have the same compositions in one or more embodiments and accordingly have substantially the same lattice constants. The first trenches 34 are equal in depth and width in some embodiments. The second trenches 40 may also have equal depth and width dimensions in some embodiments, the depth dimension exceeding the width dimension of each second trench 40 (FIG. 5) by a factor of at least three. Dimensional equality is not a requirement for either set of first or second trenches. The step of obtaining the structure as shown in FIG. 3 may, in some embodiments, include the steps of epitaxially growing a blanket layer to form the first epitaxial layer of III-V semiconductor material on the top surface of the semiconductor substrate 20, as shown schematically in FIG. 2, depositing a hard mask 32 on the first epitaxial layer 24 of III-V semiconductor material, patterning the hard mask, and etching the first epitaxial layer 24 of III-V semiconductor material to form the first trenches 34. A directional etch, such as RIE, is employed in some embodiments of the exemplary method. The dielectric regions 38 and/or associated trenches 40 have depths exceeding fifty nanometers in one or more embodiments. In some embodiments, the second layer 42 of III-V semiconductor material and dielectric regions 38 are configured to provide a plurality of electrically isolated active areas from which field effect transistors are formed. Depending on the III-V semiconductor material comprising the second layer 42, nFET or pFET devices are among the devices that can be formed using the active areas. For example, pFET devices are formed in one or more embodiments using InGaSb active areas. In some embodiments, both nFET and pFET devices are formed on the same wafer using active areas comprising different III-V semiconductor materials grown on different portions of the wafer.

An exemplary semiconductor structure includes a semiconductor substrate 20 having a first lattice constant. An epitaxial blanket layer 24 comprising III-V semiconductor material is positioned on a top surface 22 of the semiconductor substrate, the epitaxial blanket layer having a second lattice constant different from the first lattice constant. A plurality of parallel dielectric regions 38 extend vertically from a top surface 25 of the epitaxial blanket layer 24, the parallel, dielectric regions 38 defining a plurality of vertically extending trenches 40 therebetween. An epitaxial second layer 42 comprising III-V semiconductor material directly contacts the III-V epitaxial blanket layer 24 and is positioned within the vertically extending trenches. A schematic illustration of the exemplary structure 50 is shown, greatly enlarged, in FIG. 6. In some embodiments, the dielectric regions 38 and the epitaxial second layer 42 have the same depth. The III-V material comprising the blanket layer and epitaxial second layer is the same in some embodiments. In embodiments wherein the blanket layer comprises multiple III-V semiconductor sub-layers, the epitaxial second layer has the same composition and/or the same lattice constant as one or more of the multiple III-V semiconductor sub-layers that comprise the blanket layer 24 in some embodiments thereof. A multi-layer blanket layer 24 provided in accordance with some embodiments includes a III-V semiconductor sub-layer having a larger lattice constant than that of a previously deposited III-V semiconductor sub-layer that directly contacts the substrate 20. The substrate comprises silicon or germanium in some embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above" and "below" are generally employed to indicate relative positions as opposed to relative elevations unless otherwise indicated.

It will be appreciated and should be understood that the exemplary embodiments of the invention described above can be implemented in a number of different fashions. The embodiments were chosen and described in order to best explain the principles of the invention and the practical application, and to enable others of ordinary skill in the art to understand the invention for various embodiments with various modifications as are suited to the particular use contemplated. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A semiconductor structure comprising:
    a semiconductor substrate;
    an epitaxial blanket layer comprising III-V semiconductor material on a top surface of the semiconductor substrate, the epitaxial blanket layer comprising a first III-V semiconductor sub-layer directly contacting the semiconductor substrate and a second III-V semiconductor sub-layer over the first III-V semiconductor layer, the second III-V semiconductor sub-layer having a larger lattice constant than the first III-V semiconductor sub-layer, the first III-V semiconductor sub-layer including misfit defects;
    a plurality of parallel, dielectric regions extending vertically from and adjoining a top surface of the epitaxial blanket layer, the parallel, dielectric regions defining a plurality of vertically extending trenches, and
    an epitaxial second layer comprising III-V semiconductor material directly contacting the second III-V semiconductor sub-layer of the epitaxial blanket layer and positioned within the vertically extending trenches.

2. The semiconductor structure of claim 1, wherein the first III-V semiconductor sub-layer directly contacts the second III-V semiconductor sub-layer.

3. The semiconductor structure of claim 2, wherein the first III-V semiconductor sub-layer comprises gallium arsenide.

4. The semiconductor structure of claim 1, wherein the semiconductor substrate comprises at least one of silicon and germanium.

5. The semiconductor structure of claim 4, wherein at least a portion of the epitaxial blanket layer and the epitaxial second layer are comprised of the same III-V semiconductor material.

6. The semiconductor structure of claim 4, wherein the dielectric regions and the epitaxial second layer have the same depth.

7. The semiconductor structure of claim 4, wherein the vertically extending trenches each have a depth dimension and a width dimension, the depth dimension being at least three times the width dimension.

8. The semiconductor structure of claim 7, wherein the dielectric regions and the epitaxial second layer have coplanar top surfaces.

9. The semiconductor structure of claim 7, wherein the second III-V semiconductor sub-layer comprises indium gallium arsenide and the first III-V semiconductor sub-layer comprises gallium arsenide.

10. The semiconductor structure of claim 7, wherein the semiconductor substrate consists essentially of silicon.

11. The semiconductor structure of claim 7, wherein the epitaxial second layer has the same lattice constant as the second III-V semiconductor sub-layer of the epitaxial blanket layer.

* * * * *